United States Patent
Rügheimer et al.

(10) Patent No.: US 11,979,000 B2
(45) Date of Patent: May 7, 2024

(54) SURFACE-EMITTING SEMICONDUCTOR LASER CHIP

(71) Applicant: OSRAM OLED GmbH, Regensburg (DE)

(72) Inventors: Tilman Rügheimer, Regensburg (DE); Hubert Halbritter, Dietfurt (DE)

(73) Assignee: OSRAM OLED GMBH, Regensburg (DE)

( * ) Notice: Subject to any disclaimer, the term of this patent is extended or adjusted under 35 U.S.C. 154(b) by 957 days.

(21) Appl. No.: 16/964,072

(22) PCT Filed: Jan. 23, 2019

(86) PCT No.: PCT/EP2019/051629
§ 371 (c)(1),
(2) Date: Jul. 22, 2020

(87) PCT Pub. No.: WO2019/145359
PCT Pub. Date: Aug. 1, 2019

(65) Prior Publication Data
US 2021/0050710 A1    Feb. 18, 2021

(30) Foreign Application Priority Data

Jan. 24, 2018   (DE) .................... 10 2018 101 569.0

(51) Int. Cl.
*H01S 5/00*     (2006.01)
*H01S 5/02*     (2006.01)
(Continued)

(52) U.S. Cl.
CPC ........ *H01S 5/02461* (2013.01); *H01S 5/0207* (2013.01); *H01S 5/0217* (2013.01);
(Continued)

(58) Field of Classification Search
CPC .. H01S 5/02461; H01S 5/0207; H01S 5/0217; H01S 5/02469; H01S 5/04253;
(Continued)

(56) References Cited

U.S. PATENT DOCUMENTS

| 6,160,830 A | 12/2000 | Kiely et al. |
| 2002/0003822 A1* | 1/2002 | Wipiejewski ....... H01S 5/18394 |
| | | 372/45.01 |

(Continued)

FOREIGN PATENT DOCUMENTS

| DE | 10026262 B4 | 12/2001 |
| DE | 102014101818 A1 | 8/2014 |

(Continued)

*Primary Examiner* — Kinam Park
(74) *Attorney, Agent, or Firm* — MH2 TECHNOLOGY LAW GROUP LLP

(57) ABSTRACT

Surface-emitting semiconductor laser chip (1) comprising a carrier (20), a layer stack (10) arranged on the carrier (20) and having a layer plane (L) extending perpendicularly to the stacking direction (R), a front side contact (310) and a rear side contact (320), in which in operation a predetermined distribution of a current density (I) is achieved by means of current constriction in the layer stack (10), wherein in the carrier (20) an electrical through-connection (200) is provided, which extends from a bottom surface (20a) of the carrier (20) facing away from the layer stack (10) to a surface of the carrier (20) facing the layer stack (10), and the distribution of the current density (I) is significantly influenced by the shape and size of the cross-section of the through-connection (200) parallel to the layer plane (L) on the surface facing the layer stack.

11 Claims, 2 Drawing Sheets

Figure 3:
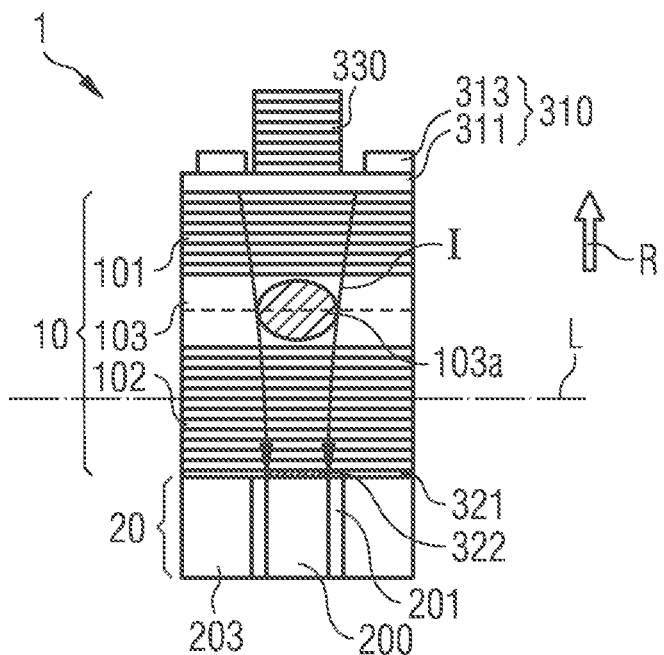

(51) Int. Cl.
*H01S 5/024* (2006.01)
*H01S 5/042* (2006.01)
*H01S 5/183* (2006.01)
*H01S 5/42* (2006.01)

(52) U.S. Cl.
CPC ...... *H01S 5/02469* (2013.01); *H01S 5/04253* (2019.08); *H01S 5/04254* (2019.08); *H01S 5/1833* (2013.01); *H01S 5/18377* (2013.01); H01S 5/021 (2013.01); H01S 5/0216 (2013.01); H01S 5/04256 (2019.08); H01S 5/18313 (2013.01); H01S 5/18327 (2013.01); H01S 5/423 (2013.01)

(58) Field of Classification Search
CPC .............. H01S 5/04254; H01S 5/1833; H01S 5/18377
See application file for complete search history.

(56) References Cited

U.S. PATENT DOCUMENTS

| | | | | |
|---|---|---|---|---|
| 2006/0018354 | A1* | 1/2006 | Albrecht | H01S 5/183 372/46.011 |
| 2007/0242716 | A1* | 10/2007 | Samal | H01S 5/1833 372/46.01 |
| 2007/0291799 | A1* | 12/2007 | Konttinen | H01S 5/04256 372/18 |
| 2008/0232412 | A1* | 9/2008 | Mizuuchi | H01S 5/18386 372/22 |
| 2009/0311847 | A1* | 12/2009 | Fehrer | B23K 26/40 257/E21.328 |
| 2013/0163627 | A1* | 6/2013 | Seurin | H01S 5/02345 372/36 |
| 2014/0231635 | A1* | 8/2014 | Kerness | H01L 31/02325 250/226 |
| 2017/0025815 | A1* | 1/2017 | Jiang | H01S 5/423 |
| 2017/0025820 | A1* | 1/2017 | Suzuki | H01S 5/18341 |

FOREIGN PATENT DOCUMENTS

| | | |
|---|---|---|
| EP | 0987800 A1 | 3/2000 |
| WO | 2003065420 A2 | 8/2003 |

* cited by examiner

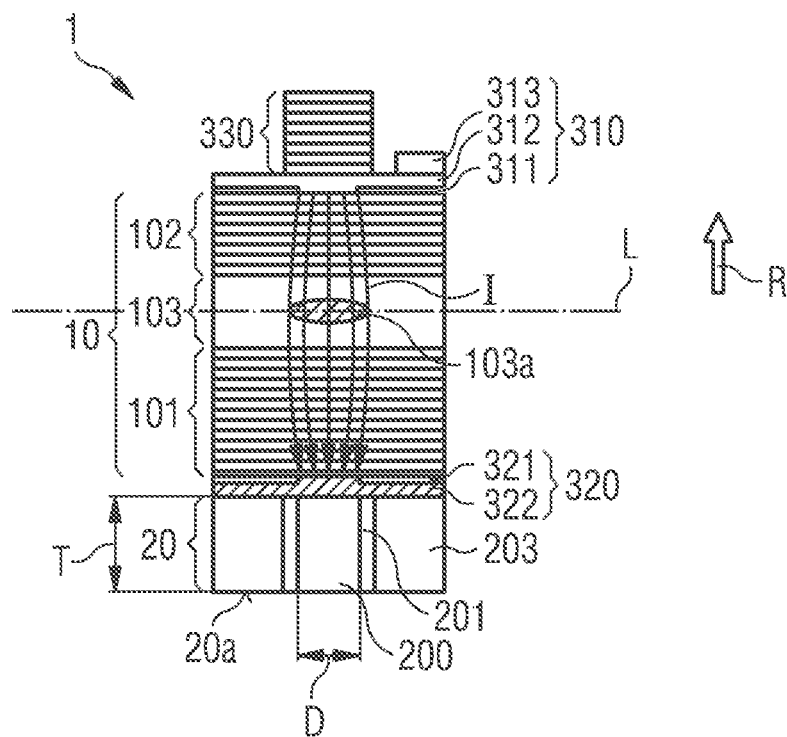
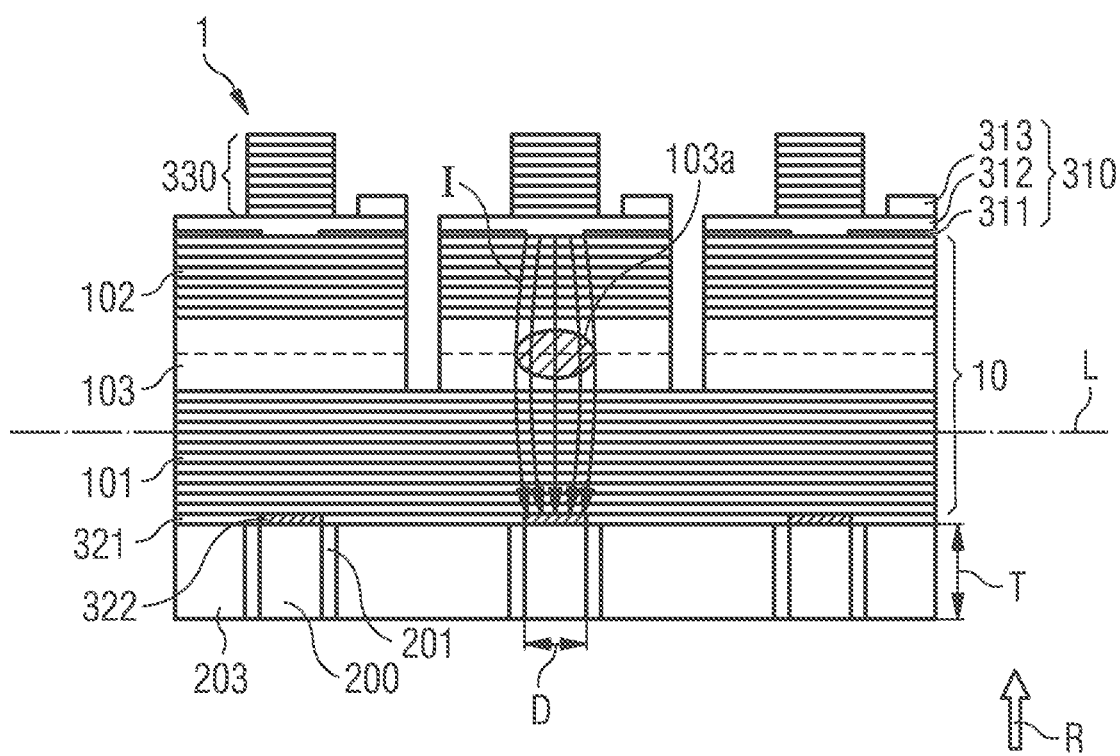

SURFACE-EMITTING SEMICONDUCTOR LASER CHIP

A vertical-cavity surface-emitting semiconductor laser chip (VCSEL) is specified. Such a semiconductor laser chip is described in principle in patent specification DE 10026262 B4.

One of the tasks to be solved is to specify a surface-emitting semiconductor laser chip that can be operated particularly efficiently and has improved thermal properties.

The surface-emitting semiconductor laser chip comprises, for example, a resonator formed by reflectors with an active region arranged between the reflectors. For example, the resonator is formed with a layer stack, wherein the reflectors are configured to reflect electromagnetic radiation generated in the active region transversely to the main extension plane of layers of the layer stack. For example, the reflectors are formed with Bragg mirrors formed with layers of the layer stack. In particular, a resonance axis of the vertical resonator runs along a stacking direction of the layer stack. The stacking direction is perpendicular to a layer plane. The layers of the layer stack extend along the layer plane, for example. For example, the semiconductor laser chip is configured to emit electromagnetic radiation along the stacking direction. In normal operation, the semiconductor laser chip emits laser radiation. For example, the laser radiation has at least a particularly high coherence length, a linear polarization and/or a wavelength bandwidth of maximum 50 nm.

In particular, the surface-emitting semiconductor laser chip is a thin-film chip in which the growth substrate on which the layer stack has been produced is removed. The growth substrate is removed from the layer stack, for example, by means of a laser lift-off process or an etching process. A laser lift-off process is described in principle in the international publication WO 03/065420 A2.

The surface-emitting semiconductor laser chip comprises a carrier on which the layer stack, a front side contact and a rear side contact are arranged. For example, the carrier is a mechanically supporting structure of the surface-emitting semiconductor laser chip. The carrier has a main plane of extension which may be transverse to the stacking direction, in particular perpendicular to the stacking direction, of the layer stack. For example, the carrier is formed with a semiconductor material, especially silicon.

The front side contact and the rear side contact may, for example, be arranged on opposite main surfaces of the layer stack. In particular, the front side contact is arranged on a side of the layer stack facing away from the carrier and the rear side contact is arranged on a side of the layer stack facing the carrier. The layer stack may be contacted electrically by means of the front side contact and the rear side contact, for example. To operate the semiconductor laser chip, for example, a predetermined electrical voltage is applied or a predetermined electrical current is applied between the front side contact and the rear side contact.

By means of current constriction, a predetermined distribution of a current density is achieved in the layer stack. For example, current constriction defines the distribution of the current density in such a way that current flowing through the active region is only applied to a part of the active region, hereinafter referred to as the active volume, with a sufficiently high current density to generate a population inversion. In particular, laser radiation is generated and amplified within the active volume during normal operation, wherein the active volume is limited within the active region by means of current constriction.

The current, the distribution of which is given to the current density by means of current constriction, is, for example, a pump current which is required to generate the population inversion within the active region.

Along the layer plane, the active volume may have a continuous, especially simply connected, cross-section. For example, the cross-section may have a circular, oval or other two-dimensional shape.

An electrical through-connection is provided in the carrier, which extends from a bottom surface of the carrier facing away from the layer stack to a surface of the carrier facing the layer stack. The through-connection is, for example, formed with an electrically conductive material. In particular, the through-connection may be formed with a metal, for example copper. To produce the through-connection, an etching process may be used to create a hole with insulating side surfaces in the carrier, which is completely filled with the material of the through-connection. Shape and size of the cross-section of the through-connection, parallel to the layer plane at the layer stack side, significantly influence the current density profile in the active region. This is particularly valid if no additional, in particular electrically insulating, structure is arranged between the through-connection and the front side contact, by means of which the distribution of the current density within the active region perpendicular to the stacking direction, i.e. laterally, is restricted. Due to the transverse conductivity of the materials used in the layer stack, a lateral current expansion in the stack is unavoidable. In particular, the active region protrudes beyond the through-connection in all directions perpendicular to the stacking direction.

According to one embodiment, the surface-emitting semiconductor laser chip comprises a carrier, a layer stack arranged on the carrier with a layer plane perpendicular to the stacking direction, a front side contact and a rear side contact. During operation, a predetermined distribution of current density is achieved by means of current constriction in the layer stack. In the carrier, an electrical through-connection is provided which extends from a bottom surface of the carrier facing away from the layer stack to a surface of the carrier facing the layer stack. The distribution of the current density is significantly influenced by the shape and size of the cross-section of the through-connection parallel to the layer plane.

A surface-emitting semiconductor laser chip described here is based on the following considerations, among others. The function and the output power of a surface-emitting semiconductor laser chip depend strongly on the current conduction within the active region. In particular, the constriction of the current along the layer plane on a narrow spatial area in which the semiconductor laser chip is to be brought to stimulated emission is of central importance. This current constriction can be realized conventionally, for example, by means of electrically insulating current apertures within the layer stack. These apertures can be formed with silicon oxide, for example. In particular, one aperture may be placed above and one below the active region to achieve a current constriction within the active region and to limit the active volume. However, the manufacture of the aperture structures requires additional process steps, which increases the manufacturing costs of a surface-emitting semiconductor laser chip. In addition, the apertures reduce the thermal conductivity of the layer stack along the stacking direction, making it difficult to dissipate heat generated during operation from the layer stack.

The surface-emitting semiconductor laser chip described here makes use, among other things, of the idea of using a carrier with a through-connection. The through-connection is configured to significantly influence the distribution of the current density within the active region by means of current constriction, whereby no further aperture is provided on the side of the layer stack facing the carrier. By means of current constriction, the efficiency of the surface-emitting semiconductor laser chip is improved so that the semiconductor laser chip can be operated for a longer period of time or with higher power with a low number of modes, in particular single mode. The series resistance may also be reduced by means of the through-connection, since the through-connection is particularly close to the layer stack, resulting in particularly low power dissipation in higher-resistance semiconductor materials. The through-connection may improve heat dissipation immediately below the region of stimulated emission.

According to one embodiment, the semiconductor laser chip is a gain-guided semiconductor laser. Here, the active volume is not significantly determined by the refractive indices of the layer stack and of materials adjacent to the layer stack, but rather, for example, by the through-connection in the manner described above. Advantageously, the shape and cross-sectional area of the region in which laser radiation is generated may thus be specified by means of current-injecting structures, in particular the through-connection.

According to one embodiment, the rear side contact is arranged between the layer stack and the carrier and is directly adjacent to the layer stack on one side and to the through-connection on the other side. The rear side contact is, for example, configured to mechanically connect the carrier, in particular the through-connection, and the layer stack firmly with each other. For example, the rear side contact is formed with a metal, especially a solder material. For example, the solder material comprises gold-tin (AuSn), nickel-tin and/or gold-Indium-tin (AuInSn). Advantageously, the direct contact of the through-connection to the rear side contact and the direct contact of the rear side contact to the layer stack enable a particularly low thermal resistance between the layer stack and the through-connection. This improves the dissipation of the heat generated during operation of the semiconductor laser chip through the through-connection.

According to one embodiment, the carrier comprises a base body formed with an electrically conductive material and a through-connection that is separated from the base body by an electrically insulating coating. For example, the layer stack is only electrically conductively connected to through-connection and electrically insulated from the base body on the rear. In particular, the through-connection is completely covered by the electrically insulating layer on its lateral surface towards the base body. In particular, the coating may be formed with a ceramic material or with silicon oxide. For example, the electrically conductive material of the base body may also have a particularly high thermal conductivity. In particular, this improves the heat dissipation of the layer stack, as the thermal resistance of the carrier is reduced overall.

According to one embodiment, the through-connection has a higher thermal conductivity than the base body. For example, the through-connection has a thermal conductivity of at least 300 watts per meter Kelvin [W/(m*K)], preferably at least 400 watts per meter Kelvin [W/(m*K)]. The base body, for example, has a thermal conductivity of maximum 200 watts per meter Kelvin [W/(m*K)], in particular maximum 150 watts per meter Kelvin [W/(m*K)]. For example, the through-connection may be formed with copper, preferably is made of copper or a copper alloy, and the base body may be formed with silicon, preferably is made of silicon. Advantageously, the particularly high thermal conductivity of the through-connection allows a particularly efficient heat dissipation of the layer stack.

According to one embodiment, the length of the through-connection through the carrier is at least ten times greater than an average diameter of the through-connection parallel to the bottom surface. For example, the through-connection has an average diameter of maximum 10 µm, especially maximum 5 µm. For example, the through-connection has a length of at least 100 µm, in particular at least 250 µm. Advantageously the average diameter of the through-connection allows the current constriction within the active region to be adjusted. In particular, the electrical and optical properties of the semiconductor laser chip can thus be determined.

According to one embodiment, the layer stack comprises an active region between a first Bragg mirror and a second Bragg mirror, wherein the second Bragg mirror is arranged on a side of the active region facing away from the carrier, and the active region completely projects beyond at least some layers of the second Bragg mirror along the layer plane. The first and second Bragg mirrors form, for example, the reflectors of the resonator. In particular, during normal operation, the active region is energized by the first Bragg mirror and by the second Bragg mirror. The Bragg mirrors, for example, are configured to reflect at least a part, preferably at least 90%, of the electromagnetic radiation generated in the active region. In particular, the second Bragg mirror has a higher reflectivity for electromagnetic radiation generated in the active region than the first Bragg mirror.

Individual layers of the second Bragg mirror may be partially removed so that these layers are protruded along the layer plane by the active region and/or the first Bragg mirror in all directions perpendicular to the stacking direction. For example, by partially removing layers of the second Bragg mirror, an additional current constriction within the active region is possible. Advantageously, a restriction of oscillation modes in the layer stack is possible in directions perpendicular to the stacking direction by means of the second Bragg mirror.

According to one embodiment, a layer of the second Bragg mirror comprises an electrically insulating aperture which defines an electrically conductive region along the layer plane, i.e. laterally. For example, the material of the aperture may be an oxidized form of the material of the electrically conductive region. In particular, to create the aperture, a layer of the second Bragg mirror is introduced from a lateral surface of the Bragg mirror. The side surface is a surface formed with a plurality of layers of the layer stack and extending transversely to the layer plane.

For example, the aperture has an inner diameter within which the electrically conductive region is located. The inner diameter of the aperture, for example, differs from the diameter of the through-connection by a maximum of 50%. In particular, the inner diameter of the aperture is larger than the diameter of the through-connection. The electrically conductive region may be arranged overlapping with the through-connection along the stacking direction. Advantageously the aperture allows current constriction within the layer stack, especially within the active region, from a side of the layer stack facing away from the carrier. Advantageously the aperture is arranged on a side of the active region facing away from the carrier, so that the aperture is not within the heat dissipation path of the semiconductor laser chip.

According to one embodiment, the layers of the layer stack are simply connected and the electrical conductivity each layers is constant along the layer plane. For example, the layers of the layer stack along the layer plane are formed continuously with the same material, in particular, the layers along the layer plane consist of the same material continuously. In particular, the layer stack is free of aperture structures that are used to constrict the current density profile. In particular, there are no aperture structures between the active region and the rear side contact. Advantageously, the layer stack has a homogeneous electrical and/or thermal conductivity along the layer plane, which allows a particularly reliable heat dissipation of the layer stack.

According to one embodiment, a second insulation layer is arranged on a side of the layer stack facing away from the carrier, wherein the second insulation layer is annular. In particular, the second insulation layer has the shape of an aperture along the layer plane. For example, the second insulation layer constricts the current within the layer stack from a side facing away from the carrier. The second insulation layer can be located on a side of the second Bragg mirror facing away from the active region. The second insulating layer is formed with silicon oxide, for example. For example, the second Bragg mirror in the center of the annular second insulation layer is electrically contacted with a first partial layer of the front side contact. The first partial layer can be formed with a transparent electrically conductive material, for example a transparent conductive oxide, in particular indium tin oxide (ITO).

According to one embodiment, the surface-emitting semiconductor laser comprises a plurality of layer stacks which are arranged along the layer plane side by side on the carrier, wherein the layer stacks are each assigned a through-connection and the through-connection is arranged along the stacking direction overlapping with the layer stack assigned to the through-connection. For example, the layer stacks are arranged side by side in the form of an array along the nodes of an imaginary regular rectangular grid. The layer stacks are, for example, produced together using the same manufacturing process. For example, some layers of different layer stacks are formed contiguously. Alternatively, the layer stacks can be arranged at a distance from one another and are not contiguous.

The layer stacks may, for example, each be contacted separately by means of the through-connection assigned to the layer stacks. Each through-connection may be separately energized independently of other through-connections so that the surface-emitting semiconductor laser forms a pixelated surface-emitting semiconductor laser.

According to one embodiment, the rear side contact is completely surrounded by a first insulation layer along the layer plane. For example, the base body is electrically insulated from the layer stack by means of the first insulation layer. In particular, the first insulation layer is directly adjacent to the base body on the one hand and to the layer stack on the other. Furthermore, the first insulation layer may be used to insulate rear side contacts of different layer stacks from each other.

For example, the first insulation layer is arranged along the stacking direction without overlapping with the through-connection. Then the first insulation layer does not cause any further current constriction in the layer stack. For example, the insulation layer has an opening in the region of the through-connection. For example, the cross-sectional area is at least as large as the cross-sectional area of the through-connection on its side facing the layer stack. In particular, the cross-sectional shapes of the opening and the through-connection are similar in a mathematical sense. Similar in the mathematical sense means that the cross-sectional shapes may be transformed into each other by similarity mapping, such as centric stretching and congruence mapping, i.e. displacements, rotations, reflections. The first insulating layer is formed, for example, with silicon oxide or an insulating ceramic material.

According to one embodiment, a third Bragg mirror is arranged on a side of the layer stack facing away from the carrier, wherein the third Bragg mirror completely overlaps with the through-connection along the stacking direction. Along the stacking direction, the third Bragg mirror is arranged, for example, completely overlapping with the active volume. In particular, the third Bragg mirror forms at least a part of the reflectors of the resonator. The third Bragg mirror may have a smaller cross-sectional area along the layer plane than the active region. For example, the active region projects beyond the third Bragg mirror along all directions perpendicular to the stacking direction. In particular, the reflectivity of the reflector on a side of the layer stack facing away from the carrier may be specified by means of the extension of the third Bragg mirror along the layer plane, whereby, for example, the optical modes of the semiconductor laser chip can be determined.

For example, the third Bragg mirror is arranged on a side of the front side contact facing away from the active region. The third Bragg mirror can be formed with an electrically insulating material. Advantageously a particularly low contact resistance of the front side contact to the active region is thus possible, since the second Bragg mirror can be particularly thin or have very few layers.

Advantageous embodiments and developments of the surface-emitting semiconductor laser chip will become apparent from the exemplary embodiments described below in association with the figures.

FIGS. 1, 2, 3, 4 and 5 show schematic sectional views of exemplary embodiments of surface-emitting semiconductor laser chips.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

FIG. 1 shows a schematic sectional view of a surface-emitting semiconductor laser chip 1 described here according to an exemplary embodiment. The surface-emitting semiconductor laser chip 1 comprises a carrier 20, a layer stack 10 arranged on the carrier 20 and having a layer plane L extending perpendicularly to the stacking direction R, a front side contact 310 and a rear side contact 320, in which during operation a predetermined distribution of a current density I is achieved by means of current constriction in the layer stack 10, wherein an electrical through-connection 200 is provided in the carrier 20. The through-connection 200 extends from a bottom surface 20a of the carrier 20 facing away from the layer stack 10 to a surface of the carrier 20 facing the layer stack 10. The distribution of the current density I is defined by the shape and size of the cross-section of the through-connection 200 parallel to the layer plane L.

The semiconductor laser chip 1 forms a gain-guided semiconductor laser in which the distribution of the current density I in an active region 103 is predetermined by means of the current constriction. The distribution of the current density I defines the shape and the cross-sectional area of an active volume 103a. The active volume 103a is that part of the active region 103 in which a population inversion is present during specified normal operation. In the present exemplary embodiment, the active volume is not formed by means of electrically insulating apertures. In particular, the layers of the layer stack 10 are simply connected and the electrical conductivity of the layers along the layer plane L is constant.

The carrier 20 comprises a base body 203, which is formed with silicon, for example, or consists in particular of silicon. The through-connection 200 is surrounded laterally, i.e. in all directions perpendicular to the stacking direction R, by a coating 201, which electrically insulates the through-connection 200 from the base body 203. The through-connection 200 has a higher thermal conductivity than the base body 203. For example, the through-connection is formed with copper and the base body with silicon. For example, the through-connection has a thermal conductivity of at least 300 watts per meter Kelvin and the base body has a thermal conductivity of maximum 200 watts per meter Kelvin.

The length T of the through-connection 200 through the carrier 20 is at least ten times greater than the average diameter D of the through-connection 200 parallel to the bottom surface 20a. For example, the diameter D is a maximum of 10 µm and the length T is at least 100 µm.

On a side of the carrier 20 facing the layer stack 10, the rear side contact 320 is arranged. The rear side contact 320 comprises a contact layer 322 and a first insulation layer 321. The contact layer 322 is formed with an electrically conductive material, for example with a solder, preferably metallic solder, alternatively with a transparent electrically conductive material, for example a transparent conductive oxide (English abbreviation: TCO). In particular, the layer stack 10 and the carrier 20 are mechanically and electrically connected to each other exclusively by means of the rear side contact. The rear side contact 320 is located between the layer stack 10 and the carrier 20 and is directly adjacent to the layer stack 10 on the one hand and to the through-connection 200 on the other hand.

The layer stack comprises an active region 103, a first Bragg mirror 101 and a second Bragg mirror 102. The first 101 and the second 102 Bragg mirrors are configured to at least partially reflect electromagnetic radiation generated in the active region 103. For example, the first 101 and/or second 102 Bragg mirrors each have at least a reflectivity of 80%, in particular 90%, for electromagnetic radiation generated in the active volume 103a.

The front side contact 310 is arranged on a side of the layer stack 10 facing away from the rear side contact 310. The front side contact 310 comprises a second insulating layer 311, a first partial layer 312 and a second partial layer 313. The first partial layer 312 and the second partial layer 313 are formed with an electrically conductive material. In particular, the first partial layer 312 is formed with a transparent electrically conductive material, for example TCO. The second partial layer 313 may be formed with a metal, for example.

In normal operation, an electrical potential difference is applied between the front side contact 310 and the rear side contact 320, so that electromagnetic radiation is generated in the active region 103. The current constriction determines the distribution of the current density I along the layer plane L, so that electromagnetic radiation is generated exclusively in an active volume 103a. The active volume 103a is arranged along the stacking direction R overlapping with the through-connection 200 and a third Bragg mirror 330. The current constriction is defined by the shape and size of the cross-section of the through-connection 200 parallel to the layer plane L.

A second insulation layer 311 is arranged on a side of the layer stack 10 facing away from the carrier 20, wherein the second insulation layer 311 is annular. The second insulating layer 311 is configured, for example, to constrict the current from the active region 103 to a side of the layer stack 10 facing away from the carrier 20. In particular, the distribution of the current density between the active region 103 and the second Bragg mirror 102 can be specified by means of an inner diameter of the annular second insulation layer 311.

The third Bragg mirror 330 is arranged on a side of the layer stack 10 facing away from the carrier 20, wherein the third Bragg mirror 330 overlaps with the through-connection 200 along the stack direction R. The third Bragg mirror 330 is arranged on a side of the front side contact 310 facing away from the active region 103. In particular, the third Bragg mirror 330 has a smaller extension than the first Bragg mirror 101, the second Bragg mirror 102 and the active region 103 along the layer plane L.

FIG. 2 shows a schematic sectional view of an exemplary embodiment of a surface-emitting semiconductor laser 1 according to an embodiment. The surface-emitting semiconductor laser 1 comprises a plurality of layer stacks 10 arranged side by side along the layer plane L on the carrier 20, wherein the layer stacks 10 are each assigned to a through-connection 200 and the through-connection 200 are arranged along the stacking direction R overlapping with the layer stack 10 assigned to the through-connection 200.

The layer stacks 10 are, for example, arranged next to each other in the form of an array at the nodes of an imaginary regular rectangular grid. The layer stacks 10 are produced together using the same manufacturing process. The first Bragg mirror 101 of the layer stacks 10 arranged next to each other is continuous. The contact layers 322, by means of which through-connections 200 and layer stacks 10 are electrically conductively connected to each other, are electrically insulated from each other by means of the first insulation layer 321.

The layer stacks 10 can each be contacted separately by means of the through-connections 200 assigned to the layer stacks 10. In particular, each through-connection 200 can be separately energized independently of other through-connections 200, so that the surface-emitting semiconductor laser 1 forms a pixelated surface-emitting semiconductor laser.

In contrast to the exemplary embodiment shown in FIG. 1, in the exemplary embodiment shown in FIG. 2 the contact layer 322 is completely surrounded by the first insulation layer 321 along all directions perpendicular to the stacking direction R, i.e. laterally. By means of the first insulation layer 321, the base body 203 is electrically insulated from the layer stack 10. In normal operation, the electric current for operating the semiconductor laser chip 1 does not flow through the material of the base body 203, but exclusively through the material of the through through-connection 200.

FIG. 3 shows a schematic sectional view of an exemplary embodiment of a surface-emitting semiconductor laser chip 1 described here. In this exemplary embodiment, the second partial layer 313 of the front side contact 310 is formed in a ring shape, wherein the third Bragg mirror 330 is arranged in the center of the second partial layer 313. In contrast to the exemplary embodiment shown in FIG. 2, the front side contact 310 is free of a second insulation layer 311, by means of which the distribution of the current density I in the active region is specified. Instead, the distribution of the current density I is specified by means of the shape and cross-sectional area of the second partial layer 313 along the layer plane L and by means of the shape and cross-sectional area of the through-connection 200 along the layer plane L.

Figure 4:
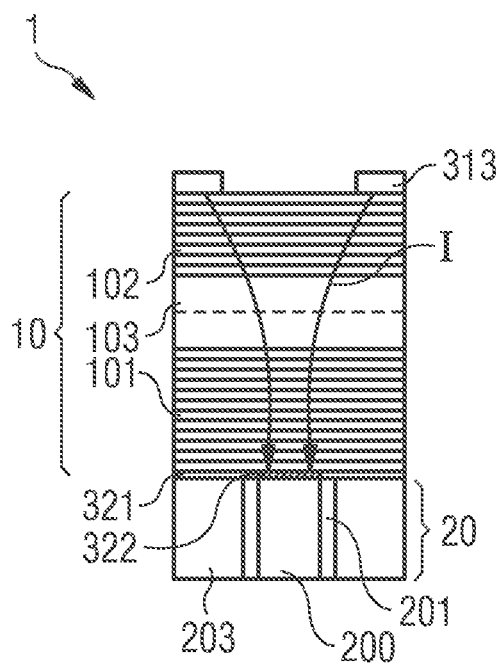

FIG. 4 shows a schematic sectional view of a surface-emitting semiconductor laser chip described here according to an exemplary embodiment. In contrast to the example shown in FIG. 3, the semiconductor laser chip 1 does not comprise a third Bragg mirror 330. Furthermore, the front side contact 310 is formed exclusively with a second partial layer 313. The second partial layer 313 is in direct contact with the second Bragg mirror 102. The second partial layer 313 is ring-shaped, so that in normal operation laser radiation generated in the active region 103 is emitted through the center of the ring-shaped second partial layer 313.

Figure 5:
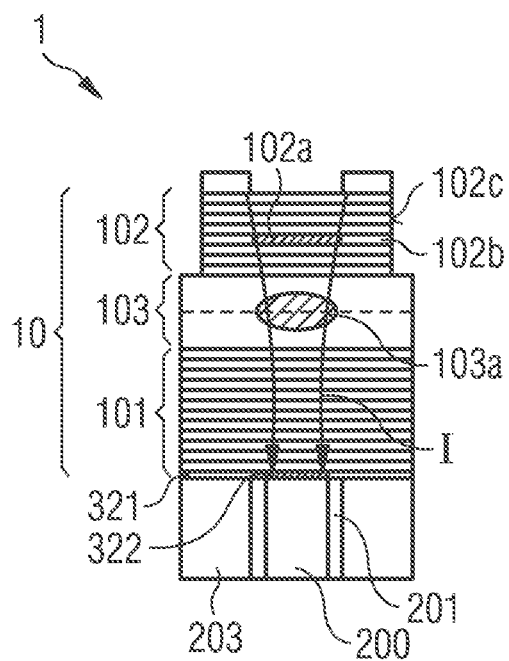

FIG. 5 shows a schematic sectional view of an exemplary embodiment of a surface-emitting semiconductor chip 1. The surface-emitting semiconductor chip 1 comprises a layer of the second Bragg mirror 102, which comprises an electrically insulating aperture 102b which defines an electrically conductive region 102a. By means of the electrically insulating aperture 102b, for example, the distribution of the current density I in the active region 103 is predetermined from a side of the active region 103 facing away from the carrier 20. Further, the active region 103 projects beyond the layers of the second Bragg mirror 102 in all directions perpendicular to the stacking direction R. In particular, the electrically insulating aperture 102b is formed with an oxidized form of the material of the electrically conductive region 102a. For example, to oxidize the material, oxygen has been introduced into the second Bragg mirror 102 from the side surface 102c. The electrically insulating aperture 102b is formed with an aluminum oxide, for example.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

This patent application claims the priority of German patent application 102018101569.0, the disclosure content of which is hereby incorporated by reference.

REFERENCE NUMERALS 1 surface-emitting semiconductor laser chip
10 layer stack
101 first Bragg mirror
102 second Bragg mirror
102a electrically conductive region
102b aperture
102c side surface
103 active region
103a active volume
20 carrier
20a bottom surface
200 through-connection
201 coating
202 conductive material
203 base body
210 first insulating layer
230 bond layer
300 electrical contact
301 first contact structure
302 second contact structure
310 front side contact
311 second insulation layer
312 first partial layer
313 second partial layer
320 rear side contact
321 first insulation layer
322 contact layer
330 third Bragg mirror
L layer plane
R stacking direction
T length of the through-connection
D diameter of the through-connection
I current density

The invention claimed is:

1. A surface-emitting semiconductor laser chip having a carrier, a layer stack arranged on the carrier and having a layer plane extending perpendicular to a stacking direction, a front side contact and a rear side contact, in which
in operation a predetermined distribution of a current density is achieved by means of current constriction in the layer stack, where
in the carrier an electrical through-connection is provided, which extends from a bottom surface of the carrier facing away from the layer stack to a surface of the carrier facing the layer stack,
the distribution of the current density is significantly influenced by the shape and size of a cross-section of the through-connection parallel to the layer plane on the surface facing the layer stack, and
the rear side contact is arranged between the layer stack and the carrier and directly adjoins the layer stack on one side and directly adjoins the through-connection on the other side.

2. The surface-emitting semiconductor laser chip according to claim 1,
in which the semiconductor laser chip forms a gain-guided semiconductor laser.

3. The surface-emitting semiconductor laser chip (1) according to claim 1, in which
the carrier comprises a base body, wherein the base body is formed with an electrically conductive material, and
the through-connection is separated from the base body by means of an electrically insulating coating.

4. The surface-emitting semiconductor laser chip according to claim 3,
in which the through-connection has a higher thermal conductivity than the base body.

5. The surface-emitting semiconductor laser chip according to claim 1,
in which the length of the through-connection through the carrier is at least ten times greater than the mean diameter of the through-connection parallel to the bottom surface.

6. The surface-emitting semiconductor laser chip according to claim 1, wherein
the layer stack comprises an active region between a first Bragg mirror and a second Bragg mirror,
the second Bragg mirror is arranged on a side of the active region facing away from the carrier, and
the active region completely projects beyond at least some layers of the second Bragg mirror in a direction perpendicular to the stacking direction.

7. The surface-emitting semiconductor laser chip according to claim 6, wherein
the layers of the layer stack are formed in a simply connected manner, and the electrical conductivity of each layer is constant along the layer plane.

8. The surface-emitting semiconductor laser chip according to claim 1, wherein
a second insulation layer is arranged on a side of the layer stack facing away from the carrier, wherein
the second insulation layer is annular.

9. The surface-emitting semiconductor laser chip according to claim 1,
in which a third Bragg mirror is arranged on a side of the layer stack facing away from the carrier, wherein the third Bragg mirror completely overlaps with the through-connection along the stacking direction.

10. A surface-emitting semiconductor laser chip having a carrier, a layer stack arranged on the carrier and having a layer plane extending perpendicular to a stacking direction, a front side contact and a rear side contact, in which in operation a predetermined distribution of a current density is achieved by means of current constriction in the layer stack,
where in the carrier an electrical through-connection is provided, which extends from a bottom surface of the carrier facing away from the layer stack to a surface of the carrier facing the layer stack, the distribution of the current density is significantly influenced by the shape and size of a cross-section of the through-connection parallel to the layer plane on the surface facing the layer stack,
wherein the carrier comprises a base body, the base body formed with an electrically conductive material, and the through-connection is separated from the base body by means of an electrically insulating coating.

11. A surface-emitting semiconductor laser chip having a carrier, a layer stack arranged on the carrier and having a layer plane extending perpendicular to a stacking direction, a front side contact and a rear side contact, in which
in operation a predetermined distribution of a current density is achieved by means of current constriction in the layer stack, wherein
in the carrier an electrical through-connection is provided, which extends from a bottom surface of the carrier facing away from the layer stack to a surface of the carrier facing the layer stack,
the distribution of the current density is significantly influenced by a shape and size of a cross-section of the through-connection parallel to the layer plane on the surface facing the layer stack, and
a length of the through-connection through the carrier is at least ten times greater than a mean diameter of the through-connection parallel to the bottom surface.

* * * * *